United States Patent
Kim et al.

(10) Patent No.: US 10,429,458 B2
(45) Date of Patent: Oct. 1, 2019

(54) RADIOFREQUENCY COIL STRUCTURE

(71) Applicants: Samsung Electronics Co., Ltd., Suwon-si (KR); Samsung Life Public Welfare Foundation, Seoul (KR)

(72) Inventors: Kyoungnam Kim, Gunpo-si (KR); Yeon Hyeon Choe, Seoul (KR)

(73) Assignees: Samsung Electronics Co., Ltd., Suwon-si (KR); Samsung Life Public Welfare Foundation, Seoul (KR)

(*) Notice: Subject to any disclaimer, the term of this patent is extended or adjusted under 35 U.S.C. 154(b) by 330 days.

(21) Appl. No.: 15/109,555

(22) PCT Filed: Jan. 2, 2015

(86) PCT No.: PCT/KR2015/000026
§ 371 (c)(1),
(2) Date: Jul. 1, 2016

(87) PCT Pub. No.: WO2015/102433
PCT Pub. Date: Jul. 9, 2015

(65) Prior Publication Data
US 2016/0327619 A1    Nov. 10, 2016

(30) Foreign Application Priority Data

Jan. 3, 2014  (KR) .................... 10-2014-0000754

(51) Int. Cl.
 G01R 33/34    (2006.01)
 G01R 33/341   (2006.01)
 G01R 33/422   (2006.01)

(52) U.S. Cl.
 CPC ..... *G01R 33/34084* (2013.01); *G01R 33/341* (2013.01); *G01R 33/422* (2013.01)

(58) Field of Classification Search
None
See application file for complete search history.

(56) References Cited

U.S. PATENT DOCUMENTS

| 4,746,866 | A | * | 5/1988 | Roschmann | ..... G01R 33/34046 324/318 |
|---|---|---|---|---|---|
| 5,017,872 | A | | 5/1991 | Foo et al. | |
| 5,865,177 | A | | 2/1999 | Segawa | |
| 7,002,347 | B2 | | 2/2006 | Feiweier et al. | |
| 7,242,192 | B2 | | 7/2007 | Warntjes | |
| 7,403,011 | B2 | | 7/2008 | Burdick, Jr. et al. | |

(Continued)

FOREIGN PATENT DOCUMENTS

| JP | 2004-16585 A | 1/2004 |
|---|---|---|
| JP | 2013-150734 A | 8/2013 |

OTHER PUBLICATIONS

Yang, Q., et al., "Manipulation of image intensity distribution at 7.0 T: passive RF shimming and focusing with dielectric materials," Journal of magnetic resonance imaging, vol. 24.1, 2006 (pp. 197-202).

*Primary Examiner* — Paresh H Patel
(74) *Attorney, Agent, or Firm* — NSIP Law

(57) ABSTRACT

An RF coil structure used for a magnetic resonance imaging (MRI) system includes an RF shield, an RF coil provided inside the RF shield, and a high dielectric material arranged between the RF shield and the RF coil, in which an interval between the RF shield and the RF coil is changed or a thickness of the high dielectric material is changed.

13 Claims, 6 Drawing Sheets

(56) References Cited

U.S. PATENT DOCUMENTS

| | | |
|---|---|---|
| 8,188,737 B2 | 5/2012 | Saha |
| 2010/0026303 A1 | 2/2010 | Zhai et al. |
| 2010/0176811 A1 | 7/2010 | Tsuda |

* cited by examiner

RADIOFREQUENCY COIL STRUCTURE

CROSS-REFERENCE TO RELATED APPLICATIONS

This application claims the benefit under 35 USC 119(a) of PCT Application No. PCT/KR2015/000026, filed on Jan. 2, 2015, which claims the benefit of Korean Patent Application No. 10-2014-0000754 filed Jan. 3, 2014, in the Korean Intellectual Property Office, the entire disclosure of which is incorporated herein by reference for all purposes.

TECHNICAL FIELD

The present disclosure relates to a radiofrequency (RF) coil structure used for a magnetic resonance imaging (MRI) system, and more particularly, to an RF coil structure which improves uniformity of a B1 magnetic field.

BACKGROUND ART

FIG. 1 illustrates a general magnetic resonance imaging (MRI) system, which is disclosed in U.S. Pat. No. 7,002,347. For convenience of explanation, terms and reference numerals are modified. An MRI system may include a magnet 1 for generating a main magnetic field, a transmitting radio frequency (RF) coil 2 for generating a magnetic field that makes hydrogen nucleuses of a test object 4 enter an excited state, a receiving RF coil 3 for receiving an RF signal generated when the excited hydrogen nucleuses of the test object 4 returns to a ground state, and a table 5 for placing the test object 4 thereon. In general, the main magnetic field is referred to as a B0 magnetic field and a magnetic field generated by the transmitting RF coil 2 is referred to as a B1 magnetic field. The B0 magnetic field is formed in a Z-axis direction and the B1 magnetic field is formed in an X-axis direction perpendicular to the direction of the B0 magnetic field. The transmitting RF coil 2 not only generates a magnetic field, but also receives an RF signal. Also, the receiving RF coil 3 not only receives the RF signal, but also generates the B1 magnetic field, if necessary. Accordingly, unless specified otherwise below, the term "RF coil" is used as having both meanings of a transmitting RF coil and a receiving RF coil. The strength and uniformity of the B0 magnetic field are important in relation to the quality of an MRI image. Also, uniformity of the B1 magnetic field is important in relation to the quality of an MRI image. Among them, regarding the B1 magnetic field generated by the transmitting RF coil 2, even when the transmitting RF coil 2 generates a uniform B1 magnetic field, the B1 magnetic field becomes irregular on the test object 4 to be measured due to a varying distance between the transmitting RF coil 2 and the test object 4.

FIG. 2 illustrates that a B1 magnetic field generated by an RF coil 6 becomes irregular on a test object due to a varying distance between the RF coil 6 and the test object.

Test objects 7 and 8 are each placed between a pair of RF coils 6. When the shape of the test object 7 is rectangular, a distance L between the RF coil 6 and the test object 7 is constant as indicated by an arrow. However, when the shape of the test object 8 is circular, the distance between the RF coil 6 and the test object 8 varies between distances L1 and L2 depending on a position on a surface of the test object 8 as indicated by arrows. As is well known to one of ordinary skill in the art, as the distance from the RF coil 6 increases, the strength of the B1 magnetic field decreases. Accordingly, the strength of the B1 magnetic field generated by the RF coil 6 is uniform at any position on the test object 7 having the constant distance L. However, the strength of the B1 magnetic field on the test object 8 having different distances L1 and L2 varies depending on the distance between the test object 8 and the RF coil 6. Since the strength of the B1 magnetic field differs at positions having a varying distance between the RF coil 6 and the test object 8, the level of excited state of hydrogen nucleuses varies accordingly and thus, the RF signal of hydrogen nucleuses used to form an MRI image of the test object differs, which deteriorates the quality of the MRI image. Even when the distance from the test object 7 is constant, the B1 magnetic field may be irregular due to a problem of the RF coil. In this case, the quality of the MRI image is also deteriorated.

To address the above problem, a variety of solutions have been developed.

Related arts to improve uniformity of the B1 magnetic field may include U.S. Pat. Nos. 5,017,872, 7,002,347, 7,242,192, and 8,188,737.

FIG. 3 illustrates an example of making a B1 magnetic field uniform, which is disclosed in U.S. Pat. No. 5,017,872. For convenience of explanation, terms and reference numerals are modified.

An RF coil structure 9 may include an RF coil 10, an RF shield 11, and a high dielectric material 12. When a test object 13 is placed inside the RF coil structure 9, the B1 magnetic field becomes irregular. To address the irregularity problem, the high dielectric material 12 fills a space between the RF coil 10 and the RF shield 11.

FIG. 4 illustrates an example of making a B1 magnetic field uniform, which is disclosed in U.S. Pat. No. 7,242,192. For convenience of explanation, terms and reference numerals are modified.

An RF coil structure 14 may include a main RF coil 15 and an auxiliary RF coil 16. Although not illustrated in the drawing, when the RF coil structure 14 is in use, a distance between a test object and the RF coil structure 14 is not constant and thus the B1 magnetic field is not uniform. To address this problem, the auxiliary RF coil 16 is arranged to make the B1 magnetic field uniform.

However, among the above-described structures used to make the B1 magnetic field uniform, in the structure of FIG. 3, since the high dielectric material 12 is uniformly arranged between the RF shield 11 and the RF coil 10, it may be difficult to overcome an influence of the difference in the distance between the test object and the RF coil (to be described in relation to FIG. 5). Also, in the structure of FIG. 4, it is inconvenient to use the auxiliary RF coil 15, in addition to the main RF coil 15.

DETAILED DESCRIPTION OF THE INVENTIVE CONCEPT

Technical Problem

The present disclosure provides a radiofrequency (RF) structure used for a magnetic resonance imaging (MRI) system. The technical problems to be solved by the present disclosure are not limited to the above technical problems, and other technical problems may be inferred from the following embodiments.

Technical Solution

This section provides a general summary of the disclosure and is not a comprehensive disclosure of its full scope or all of its features.

According to one aspect of the present disclosure, there is provided a radiofrequency (RF) coil structure used for a magnetic resonance imaging (MRI) system, which includes an RF shield, an RF coil provided inside the RF shield, and a high dielectric material arranged between the RF shield and the RF coil, in which an interval between the RF shield and the RF coil is changed.

According to another aspect of the present disclosure, there is provided an RF coil structure used for an MRI system, which includes an RF shield, an RF coil provided inside the RF shield, and a high dielectric material arranged between the RF shield and the RF coil, in which a thickness of the high dielectric material is changed.

Advantageous Effects

The uniformity of a B1 magnetic field in a radiofrequency (RF) coil structure may be improved by using the RF coil structure according to the present disclosure. Furthermore, irregularity of a B1 magnetic field on the test object generated due to a varying distance between the RF coil and the test object may be effectively reduced.

BEST MODE

A radiofrequency (RF) coil structure used for a magnetic resonance imaging (MRI) system includes an RF shield, an RF coil provided inside the RF shield, and a high dielectric material arranged between the RF shield and the RF coil, in which an interval between the RF shield and the RF coil is changed.

An RF coil structure used for an MRI system includes an RF shield, an RF coil provided inside the RF shield, and a high dielectric material arranged between the RF shield and the RF coil, in which a thickness of the high dielectric material is changed.

Mode of the Inventive Concept

The present disclosure will now be described in detail with reference to the accompanying drawings.

Figure 3:
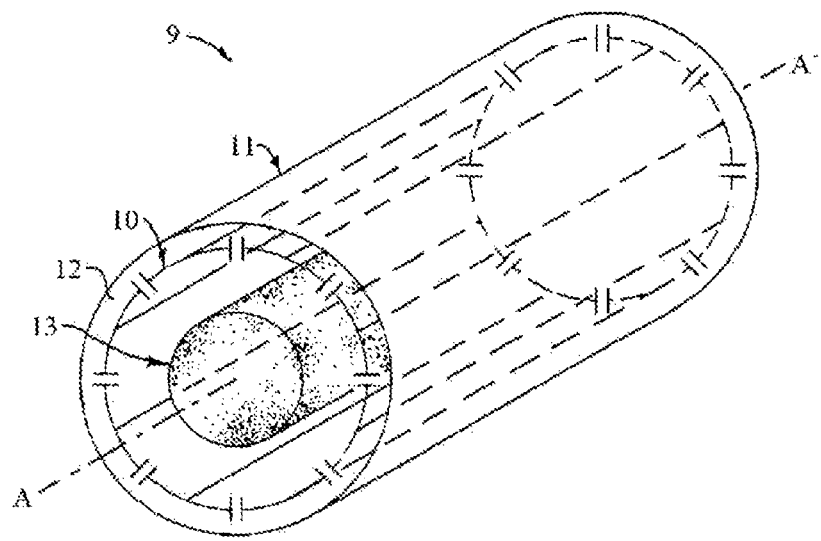
FIG. 3 illustrates an example of making a B1 magnetic field uniform, which is disclosed in U.S. Pat. No. 5,017,872.
Figure 4:
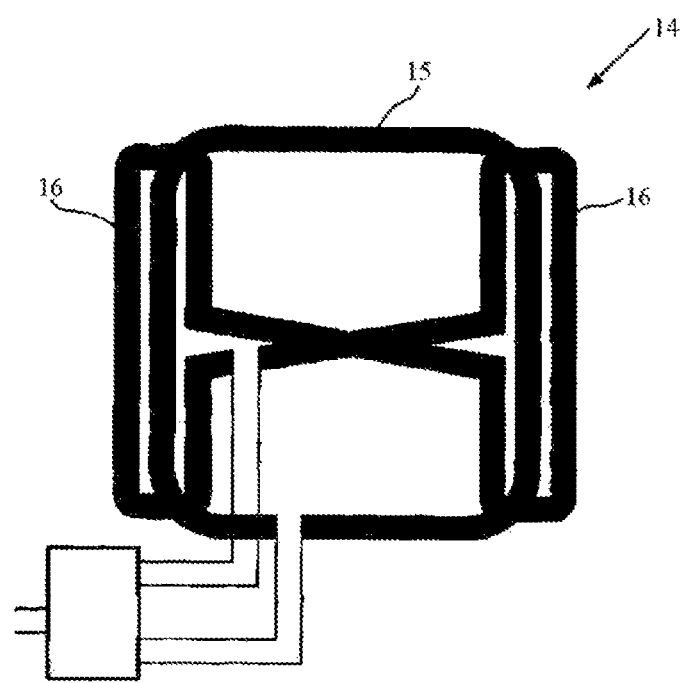
FIG. 4 illustrates an example of making a B1 magnetic field uniform, which is disclosed in U.S. Pat. No. 7,242,192.
Figure 5:
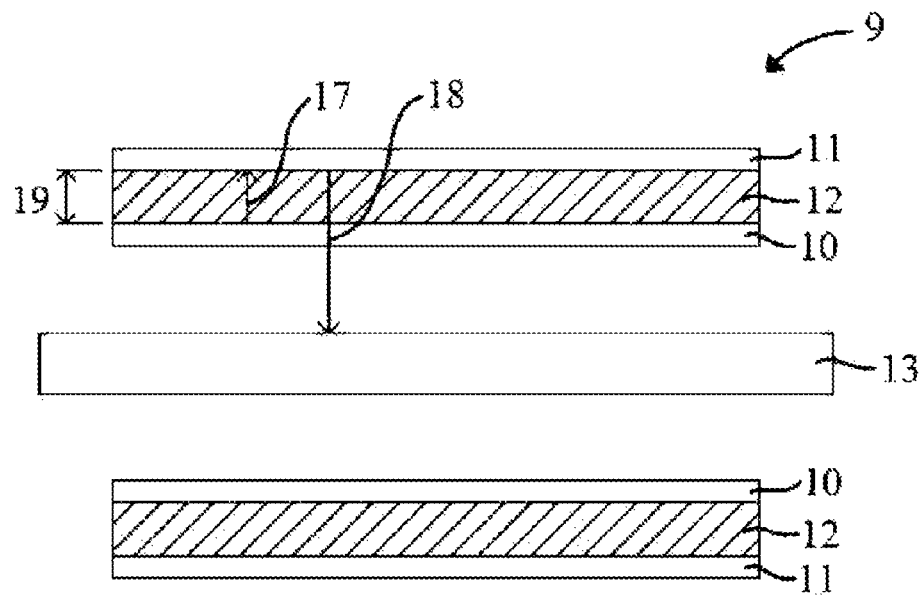
FIG. 5 is a cross-section taken along a line AA', showing the related art disclosed in FIG. 3.

FIG. 5 is a cross-section taken along a line AA', showing the related art disclosed in FIG. 3.

Figure 1:
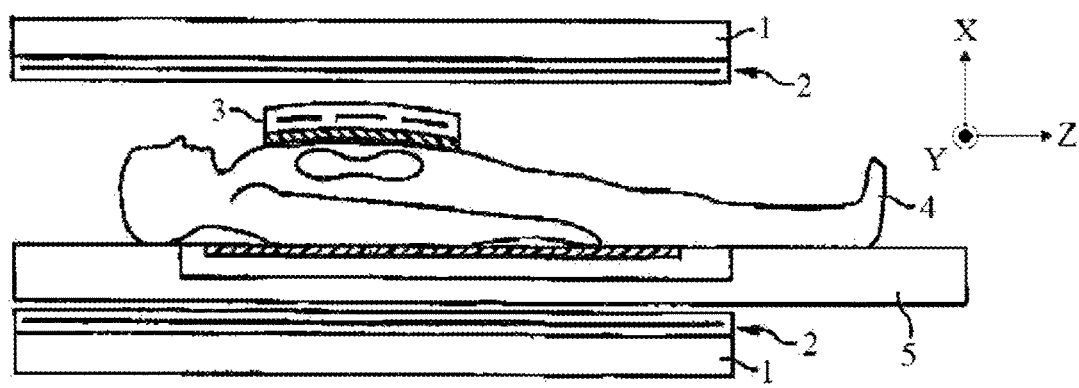
FIG. 1 illustrates an example of a general magnetic resonance imaging (MRI) system.
Figure 2:
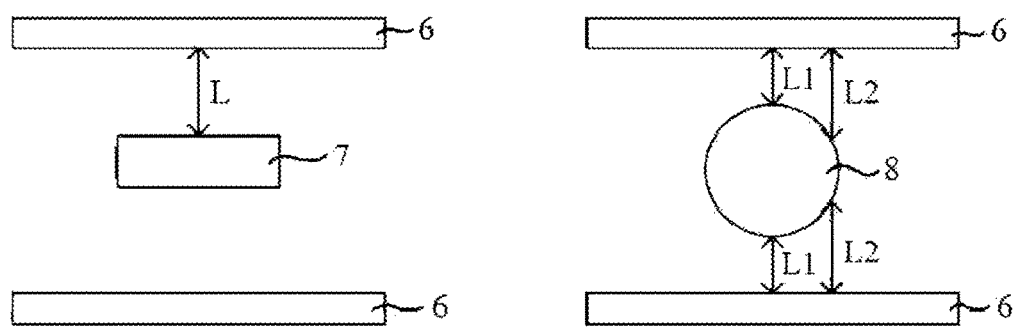
FIG. 2 illustrates that a B1 magnetic field generated by a radiofrequency (RF) coil becomes irregular on a test object due to a varying distance between the RF coil and the test object.

A radiofrequency (RF) coil structure 9 of the related art may include an RF coil 10, an RF shield 11, and a high dielectric material 12. In the case of a related art, a distance 19 between the RF coil 10 and the RF shield 11 is maintained constant. As is well known to one of ordinary skill in the art, the RF shield 11 prevents a B1 magnetic field generated by the RF coil 10 from escaping outside the RF coil structure 9 and simultaneously reflects the B1 magnetic field in a direction toward a test object 13. A B1 magnetic field 17 generated by the RF coil 10 and proceeding in a direction toward the RF shield 11 is reflected by the RF shield 11 and then the reflected B1 magnetic field 17 becomes a B1 magnetic field 18 that proceeds toward the test object 13. In this state, the B1 magnetic fields 17 and 18 pass through the high dielectric material 12. While passing through the high dielectric material 12, the strength of the B1 magnetic fields 17 and 18 is reinforced. Accordingly, as a distance in which the B1 magnetic fields 17 and 18 pass through the high dielectric material 12 increases, the strength of the B1 magnetic field increases. However, in the related art, as the B1 magnetic fields 17 and 18 pass through the same distance 19, the B1 magnetic field 18 having passed through high dielectric material 12 has the same strength at any position in the RF coil structure 9. Accordingly, the above structure is advantageous in obtaining a strong and uniform B1 magnetic field when the distance between the RF coil 10 and the test object 13 is the same at any position as in the case when the shape of a test object is rectangular like the test object 7 of FIG. 2. However, when the distance between the RF coil 10 and the test object 13 is not the same at any position as in the case when the shape of a test object is circular like the test object 8 of FIG. 2, the above structure is not advantageous in obtaining a strong and uniform B1 magnetic field.

Figure 6:
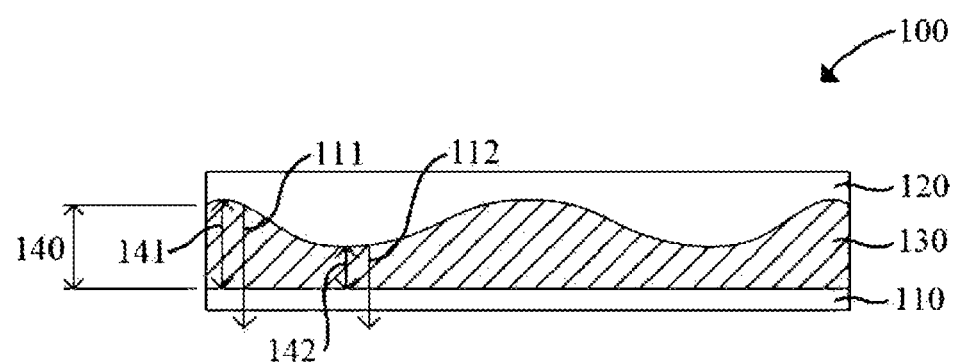
FIG. 6 illustrates an RF coil structure according to an embodiment of the present disclosure.

FIG. 6 illustrates an RF coil structure 100 according to an embodiment of the present disclosure.

For convenience of explanation, the RF coil structure 100 is illustrated as a cross-sectional view, as in FIG. 5. However, unlike FIG. 5, a test object and a cross-section of a lower part of the RF coil structure 100 under the test object are omitted, and only a cross-section of an upper part of the RF coil structure 100 is illustrated.

The RF coil structure 100 according to the present disclosure may include an RF coil 110, an RF shield 120, and a high dielectric material 130. An interval 140 between the RF shield 120 and the RF coil 110 is not constant, unlike the related art. In other words, there is a portion 141 having a relatively large interval and a portion 142 having a relatively small interval. Also, the high dielectric material 130 fully fills a space between the RF coil 110 and the RF shield 120. As the interval 140 between the RF shield 120 and the RF coil 110 varies and the space between the RF coil 110 and the RF shield 120 is filled with the high dielectric material 130, the B1 magnetic field generated by the RF coil 110 and reflected from the RF shield 120 may have a different strength depending on a position of the B1 magnetic field. For example, the strength of a B1 magnetic field 111 having passed through the portion 141 having a relatively large interval is greater than the strength of the B1 magnetic field 112 having passed through the portion 142 having a relatively small interval. $BaTio_3$, $CaTio_3$, and $MgTio_3$ are used as the high dielectric material 130.

Figure 7:
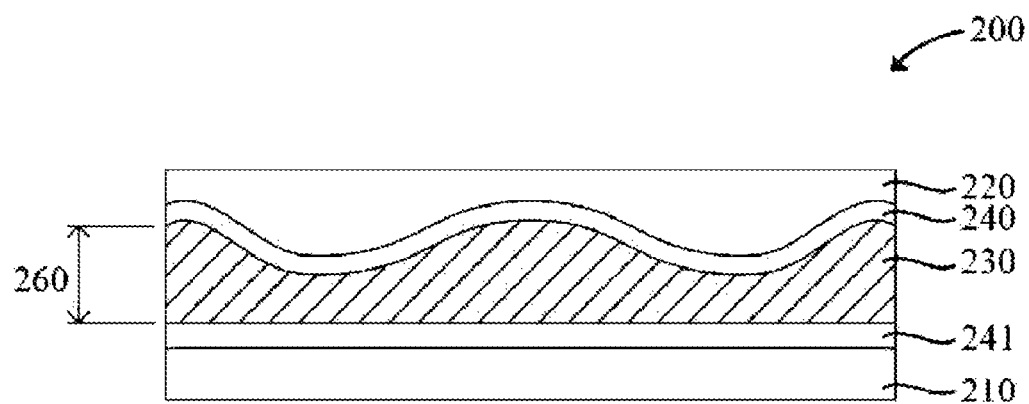
FIG. 7 illustrates an RF coil structure according to another embodiment of the present disclosure.
Figure 7:
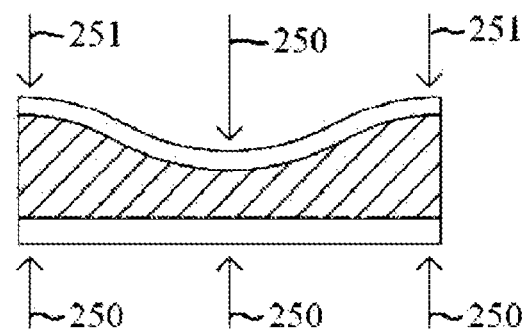

FIG. 7 illustrates an RF coil structure 200 according to another embodiment of the present disclosure.

For convenience of explanation, the RF coil structure 200 is illustrated as a cross-sectional view, as in FIG. 5. However, unlike FIG. 5, a test object and a cross-section of a lower part of the RF coil structure 200 under the test object are omitted, and only a cross-section of an upper part of the RF coil structure 200 is illustrated.

The RF coil structure 200 according to the present disclosure may include an RF coil 210, an RF shield 220, a high dielectric material 230, and housings 240 and 241 having a sealed structure and accommodating the high dielectric material 230. The shapes of the high dielectric material 230 and the housings 240 and 241 may be changed by an external force. For example, when the high dielectric material 230 is in a liquid state and the housings 240 and 241 are formed of a flexible material, the shapes of the high dielectric material 230 and the housings 240 and 241 may be changed by external forces 250 and 251. When the external force 250 is greater than the external force 251, a portion of the housing 240 in an upper side, which is pressed by the external force 250, is further pushed inwardly. The shape of the housing 241 in the lower side is not changed because the same external force 250 is applied to the housing 241. Accordingly, when an interval 260 between the RF coil 210 and the RF shield 220 is changed, the shapes of the housings 240 and 241 accommodating the high dielectric material 230 that fully fills in a space between the RF coil 210 and the RF shield 220 are changed according to a change in the interval 260.

For example, when the shape of the RF shield 220 is changed in a form of waves, as illustrated in FIG. 7, and thus the interval 260 is changed, the housing 240 in the upper side may be changed in a form of waves like the shape of the RF shield 220.

Figure 8:
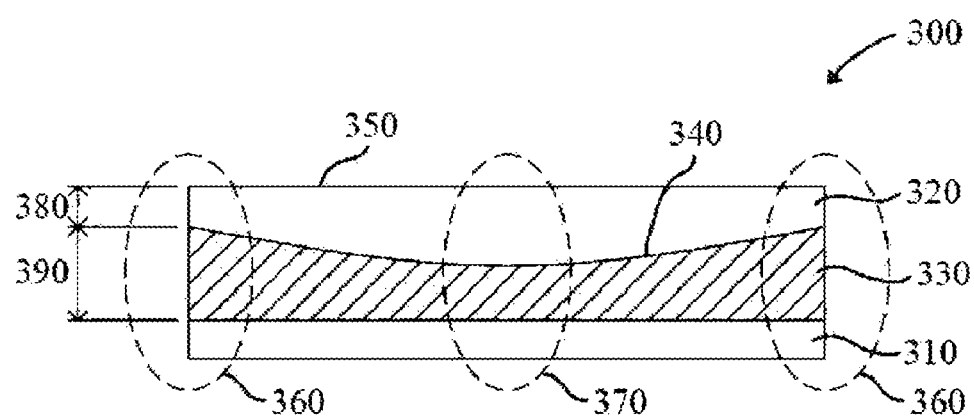
FIG. 8 illustrates an RF coil structure according to another embodiment of the present disclosure.

FIG. 8 illustrates an RF coil structure 300 according to another embodiment of the present disclosure.

For convenience of explanation, the RF coil structure 300 is illustrated as a cross-sectional view, as in FIG. 5. However, unlike FIG. 5, a test object and a cross-section of a lower part of the RF coil structure 300 under the test object are omitted, and only a cross-section of an upper part of the RF coil structure 300 is illustrated.

The RF coil structure 300 according to the present disclosure may include an RF coil 310, an RF shield 320, and a high dielectric material 330. The high dielectric material 330 contacts the RF coil 310 and the RF shield 320, and fully fills a space between the RF coil 310 and the RF shield 320. A tangent line where the high dielectric material 330 and the RF shield 320 contact each other is referred to a boundary line 340, and a line at an outer side of the RF shield 320 corresponding to the boundary line 340 is referred to as an outer line 350. An interval 390 between the RF coil 310 and the RF shield 320 is changed according to a change in the shape of the boundary line 340. In this state, the outer line 350 is not changed. In the RF coils having a cylindrical shape illustrated in FIGS. 5 to 8, the strength of the B1 magnetic field is generally weaker in an edge portion 360 than in a middle portion 370. There is a case in which the strength of the B1 magnetic field inside a cylindrical RF coil needs to be uniform regardless of a distance from a test object. An interval 380 between the boundary line 340 and the outer line 350 gradually decreases from the middle portion 370 toward the edge portion 360. Accordingly, the B1 magnetic field reflected from the RF shield 320 in the edge portion 360 passes through the high dielectric material 330 along a longer path and thus the strength of a magnetic field is reinforced. Thus, the strength of the B1 magnetic field inside a cylindrical RF coil may be made uniform.

Figure 9:
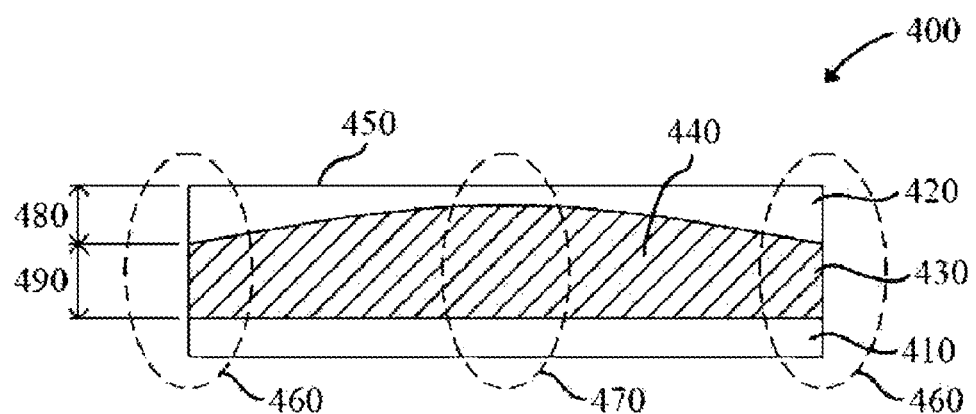
FIG. 9 illustrates an RF coil structure according to another embodiment of the present disclosure.

FIG. 9 illustrates an RF coil structure 400 according to another embodiment of the present disclosure.

For convenience of explanation, the RF coil structure 400 is illustrated as a cross-sectional view, as in FIG. 5. However, unlike FIG. 5, a test object and a cross-section of a lower part of the RF coil structure 400 under the test object are omitted, and only a cross-section of an upper part of the RF coil structure 400 is illustrated.

The RF coil structure 400 according to the present disclosure may include an RF coil 410, an RF shield 420, and a high dielectric material 430. The high dielectric material 430 contacts the RF coil 410 and the RF shield 420, and fully fills a space between the RF coil 410 and the RF shield 420. A tangent line where the high dielectric material 430 and the RF shield 420 contact each other is referred to a boundary line 440, and a line at an outer side of the RF shield 420 corresponding to the boundary line 440 is referred to as an outer line 450. An interval 490 between the RF coil 410 and the RF shield 420 is changed according to a change in the shape of the boundary line 440. When a test object is located in a middle portion 470, the strength of the B1 magnetic field in a portion other than the middle portion 470 needs to be decreased. An interval 480 between the boundary line 440 and the outer line 450 gradually increases from the middle portion 470 toward an edge portion 460. Accordingly, the B1 magnetic field reflected from the RF shield 420 in the edge portion 460 passes through the high dielectric material 430 along a shorter path and thus the strength of a magnetic field in the edge portion 460 is weakened. Thus, the strength of the B1 magnetic field in the middle portion 470 may only be increased.

Figure 10:
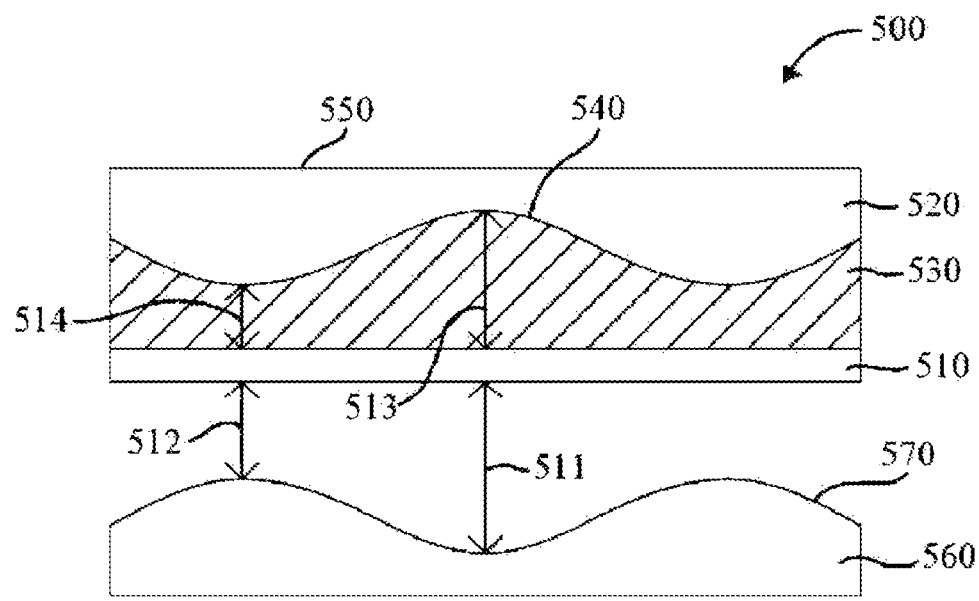
FIG. 10 illustrates an RF coil structure according to another embodiment of the present disclosure.

FIG. 10 illustrates an RF coil structure 500 according to another embodiment of the present disclosure.

For convenience of explanation, the RF coil structure 500 is illustrated as a cross-sectional view, as in FIG. 5. However, unlike FIG. 5, a test object and a cross-section of a lower part of the RF coil structure 500 under the test object are omitted, and only a cross-section of an upper part of the RF coil structure 500 is illustrated.

The RF coil structure 500 according to the present disclosure may include an RF coil 510, an RF shield 520, and a high dielectric material 530. The high dielectric material 530 contacts the RF coil 510 and the RF shield 520, and fully fills a space between the RF coil 510 and the RF shield 520. A tangent line where the high dielectric material 530 and the RF shield 520 contact each other is referred to a boundary line 540, and a line at the outer side of the RF shield 520 corresponding to the boundary line 540 is referred to as an outer line 550. An interval between the RF coil 510 and the RF shield 520 is changed according to a change in the shape of the boundary line 540. In this state, the outer line 550 is not changed. When a surface line 570 of a test object 560 is not a straight line, the strength of a B1 magnetic field needs to be uniformly distributed. The strength of the B1 magnetic field in a portion of the test object 560 where the strength of the B1 magnetic field is weak due to a relatively long distance 511 between the RF coil 510 and the test object 560 may be reinforced by increasing a distance 513 in which the B1 magnetic field reflected from the RF shield 520 passes through the high dielectric material 530 by changing the shape of the boundary line 540 to be opposite to the shape of the surface line 570 of the test object 560. Also, the strength of the B1 magnetic field in a portion of the test object 560 where the strength of the B1 magnetic field is strong due to a relatively short distance 512 between the RF coil 510 and the test object 560 may be weakened by decreasing a distance 514 by which the B1 magnetic field reflected from the RF shield 520 passes through the high dielectric material 530 by changing the shape of the boundary line 540 to be opposite to the shape of the surface line 570 of the test object 560. Thus, the strength of the B1 magnetic field in the test object 560 may be made uniform.

Figure 11:
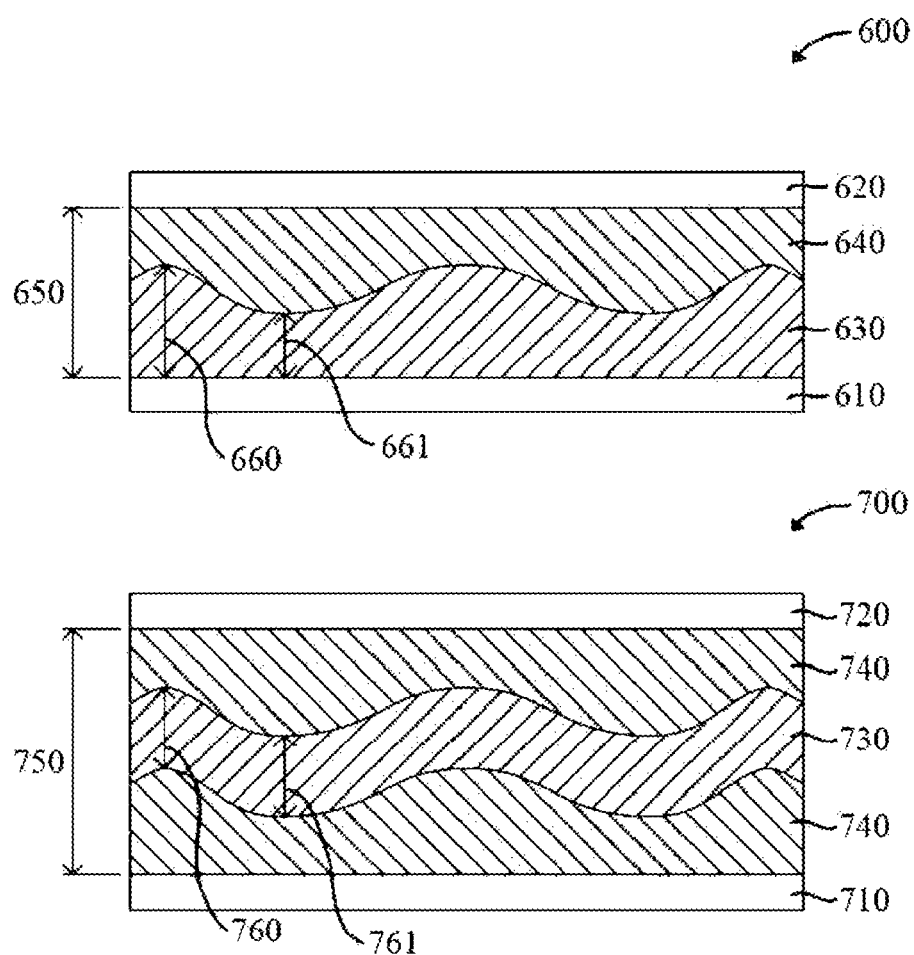
FIG. 11 illustrates an RF coil structure according to another embodiment of the present disclosure.

FIG. 11 illustrates RF coil structures 600 and 700 according to embodiments of the present disclosure.

For convenience of explanation, each of the RF coil structures 600 and 700 are illustrated as a cross-sectional view, as in FIG. 5. However, unlike FIG. 5, a test object and a cross-section of a lower part of each of the RF coil structures 600 and 700 under the test object are omitted, and only a cross-section of an upper part of each of the RF coil structures 600 and 700 is illustrated.

The RF coil structures 600 and 700 according to the present disclosure may, respectively, include RF coils 610 and 710, RF shields 620 and 720, and high dielectric materials 630 and 730. Portions between the RF coils 610 and 710 and the RF shields 620 and 720, which are not respectively filled with the high dielectric materials 630 and 730, are respectively filled with materials 640 and 740 other than the high dielectric materials 630 and 730. The materials 640 and 740 other than the high dielectric materials 630 and 730 may be any material capable of filling an empty space unless it affects a magnetic field.

In the above description, a case in which a space between the RF coil and the RF shield is fully filled with the high dielectric material is described. However, the present disclosure is based on the strength of a B1 magnetic field varying depending on a distance by which the B1 magnetic field reflected from RF shield passes through the high dielectric material. Accordingly, the present disclosure may include a case in which a distance by which the B1 magnetic field reflected from the RF shield passes through the high dielectric material varies even when the space between the RF coil and the RF shield is not fully filled with the high dielectric material. For example, the present disclosure may include a case in which thicknesses 660, 661, 760, and 761 of the high dielectric materials 630 and 730 vary even when distances 650 and 750 between the RF coils 610 and 710 and the RF shields 620 and 720 are constant, as illustrated in FIG. 11. Accordingly, the embodiments described in FIGS. 6 to 10 may be applied to the embodiment of FIG. 11 without change. For example, to obtain the same effect as that of the embodiment of FIG. 8, the thickness of the high dielectric material may be gradually increased from a middle portion toward an edge portion.

Various embodiments according to the present disclosure are described below.

(1) A radiofrequency (RF) coil structure used for a magnetic resonance imaging (MRI) system including an RF shield, an RF coil provided inside the RF shield, and a high dielectric material arranged between the RF shield and the RF coil, in which an interval between the RF shield and the RF coil is changed.

(2) The RF coil structure in which the high dielectric material is at least one of $BaTiO_3$, $CaTiO_3$, and $MgTiO_3$.

(3) The RF coil structure in which the RF coil structure further includes a housing filled with the high dielectric material, wherein a shape of the housing varies to fill a space between the RF shield and the RF coil as the interval between the RF shield and the RF coil is changed.

(4) The RF coil structure in which the high dielectric material is in a liquid state.

(5) The RF coil structure in which the high dielectric material contacts the RF shield and the RF coil.

(6) The RF coil structure in which a shape of a boundary line contacting the high dielectric material on a section of the RF shield varies.

(7) The RF coil structure in which an outer line of the RF shield corresponding to the boundary line of the RF shield is a straight line.

(8) The RF coil structure in which a distance between the boundary line and the outer line of the RF shield decreases from a middle portion toward an edge portion of the RF coil structure.

(9) The RF coil structure in which a distance between the boundary line and the outer line of the RF shield decreases from an edge portion of the RF coil structure toward a middle portion.

(10) The RF coil structure in which a shape of the boundary line of the RF shield is changed according to a shape of a surface of a test object.

(11) The RF coil structure in which the shape of the boundary line of the RF shield is changed to be opposite to the shape of the surface of the test object.

(12) A radiofrequency (RF) coil structure used for a magnetic resonance imaging (MRI) system including an RF shield, an RF coil provided inside the RF shield, and a high dielectric material arranged between the RF shield and the RF coil, in which a thickness of the high dielectric material is changed.

(13) The RF coil structure in which the thickness of the high dielectric material increases from a middle portion toward an edge portion of the RF coil structure.

(14) The RF coil structure in which the thickness of the high dielectric material decreases from the middle portion toward the edge portion of the RF coil structure.

(15) The RF coil structure in which the thickness of the high dielectric material is changed according to a shape of a surface of a test object.

(16) The RF coil structure in which the thickness of the high dielectric material is changed to be opposite to the shape of the surface of the test object.

(17) The RF coil structure in which the RF coil structure further includes a housing filled with the high dielectric material, wherein a shape of the housing varies according to a change in the thickness of the high dielectric material.

(18) The RF coil structure in which the high dielectric material is in a liquid state.

As the RF coil structure according to the present disclosure is used, the uniformity of a B1 magnetic field in the RF coil structure may be improved. Furthermore, irregularity of a B1 magnetic field on the test object, generated due to a varying distance between the RF coil and the test object, may be effectively reduced.

The invention claimed is:

1. A radiofrequency (RF) coil structure used for a magnetic resonance imaging (MRI) system, the RF coil structure comprising:
   an RF shield;
   an RF coil provided inside the RF shield; and
   a high dielectric material arranged between the RF shield and the RF coil,
   wherein an interval between the RF shield and the RF coil is configured to be varied along a shape of a boundary line of the RF shield, the shape of the boundary line being a tangent line where the high dielectric material and the RF shield contact each other, and
   wherein the shape of a boundary line is varied to be opposite to a shape of a surface line of a test object, such that a strength of a magnetic field in the test object is uniform along the surface line of the test object.

2. The RF coil structure of claim 1, wherein the high dielectric material is at least one of BaTio3, CaTio3, and MgTio3.

3. The RF coil structure of claim 1, further comprising a housing filled with the high dielectric material, wherein a shape of the housing is configured to vary to fill a space between the RF shield and the RF coil in response to a variation the interval between the RF shield and the RF coil.

4. The RF coil structure of claim 3, wherein the high dielectric material is in a liquid state.

5. The RF coil structure of claim 1, wherein the high dielectric material contacts the RF shield and the RF coil.

6. The RF coil structure of claim 1, wherein an outer line of the RF shield is a straight line.

7. The RF coil structure of claim 6, wherein a distance between the boundary line and the outer line of the RF shield decreases from a middle portion toward an edge portion of the RF coil structure.

8. The RF coil structure of claim 6, wherein a distance between the boundary line and the outer line of the RF shield decreases from an edge portion toward a middle portion of the RF coil structure.

9. A radiofrequency (RF) coil structure used for a magnetic resonance imaging (MRI) system, the RF coil structure comprising:
an RF shield;
an RF coil provided inside the RF shield; and
a high dielectric material arranged between the RF shield and the RF coil,
wherein a thickness of the high dielectric material is configured to be varied along a shape of a boundary line of the RF shield, the shape of the boundary line being a tangent line where the high dielectric material and the RF shield contact each other, and
wherein the shape of a boundary line is varied to be opposite to a shape of a surface line of a test object, such that a strength of a magnetic field in the test object is uniform along the surface line of the test object.

10. The RF coil structure of claim 9, wherein the thickness of the high dielectric material increases from a middle portion toward an edge portion of the RF coil structure.

11. The RF coil structure of claim 9, wherein the thickness of the high dielectric material decreases from a middle portion toward an edge portion of the RF coil structure.

12. The RF coil structure of claim 9, further comprising a housing filled with the high dielectric material, wherein a shape of the housing varies according to a change in the thickness of the high dielectric material.

13. The RF coil structure of claim 12, wherein the high dielectric material is in a liquid state.

* * * * *